(12) United States Patent
Chen et al.

(10) Patent No.: US 11,209,132 B2
(45) Date of Patent: Dec. 28, 2021

(54) LIGHT SOURCE DEVICE

(71) Applicant: YLX Incorporated, Shenzhen (CN)

(72) Inventors: Bin Chen, Shenzhen (CN); Yi Li, Shenzhen (CN)

(73) Assignee: YLX Incorporated, Shenzhen (CN)

( * ) Notice: Subject to any disclaimer, the term of this patent is extended or adjusted under 35 U.S.C. 154(b) by 0 days.

(21) Appl. No.: 17/256,857

(22) PCT Filed: Mar. 1, 2019

(86) PCT No.: PCT/CN2019/076655
§ 371 (c)(1),
(2) Date: Dec. 29, 2020

(87) PCT Pub. No.: WO2020/001057
PCT Pub. Date: Jan. 2, 2020

(65) Prior Publication Data
US 2021/0156526 A1 May 27, 2021

(30) Foreign Application Priority Data
Jun. 29, 2018 (CN) .......................... 201810712947.3

(51) Int. Cl.
*F21K 9/68* (2016.01)
*F21K 9/61* (2016.01)
(Continued)

(52) U.S. Cl.
CPC .................. *F21K 9/68* (2016.08); *F21K 9/61* (2016.08); *F21V 7/04* (2013.01); *F21V 7/10* (2013.01);
(Continued)

(58) Field of Classification Search
None
See application file for complete search history.

(56) References Cited

U.S. PATENT DOCUMENTS

2013/0250381 A1* 9/2013 Toko ...................... F21S 41/176
359/19
2014/0168940 A1* 6/2014 Shiomi ...................... F21V 9/08
362/84
(Continued)

FOREIGN PATENT DOCUMENTS

CN 102305386 1/2012
CN 103792766 5/2014
(Continued)

OTHER PUBLICATIONS

International Search Report for International Application PCT/CN2019/076655, dated May 30, 2019.
Office Action issued in corresponding CN Application 201810712947.3, dated Jan. 20, 2021.

*Primary Examiner* — Elmito Breval
(74) *Attorney, Agent, or Firm* — Burris Law, PLLC

(57) ABSTRACT

A light source device includes a laser light source for emitting a first light, a refractive optical element disposed on a light exiting path of the laser light source and configured to guide the first light to a light conversion device. The refractive optical element includes a light-exiting surface and light refracted by the light-exiting surface of the refractive optical element is deflected towards the light conversion device to exit. The light conversion device is disposed at a light-exiting side of the refractive optical element and the incident surface and light-exiting surface thereof are the same surface. The medium of the incident surface of the light conversion device has Brewster's angle of a and outgoing light of the refractive optical element is obliquely incident to the light conversion device at an incident angle of α−20° to α+10°. Also, the light collecting device is disposed at the light-exiting side of the light conversion device and configured to collect light emitted from the light conversion device and then emit it.

11 Claims, 7 Drawing Sheets

(51) Int. Cl.
*F21V 7/04* (2006.01)
*F21V 7/10* (2006.01)
*F21V 13/14* (2006.01)
*G03B 21/20* (2006.01)
*H01S 3/08* (2006.01)

(52) U.S. Cl.
CPC ............ *F21V 13/14* (2013.01); *G03B 21/204* (2013.01); *H01S 3/08059* (2013.01)

(56) References Cited

U.S. PATENT DOCUMENTS

| | | | |
|---|---|---|---|
| 2018/0233633 A1* | 8/2018 | Yamanaka | H01L 33/0054 |
| 2018/0301869 A1* | 10/2018 | Maemura | F21V 9/32 |
| 2019/0011100 A1* | 1/2019 | Son | H05B 47/10 |

FOREIGN PATENT DOCUMENTS

| | | |
|---|---|---|
| CN | 105003843 | 10/2015 |
| CN | 105911805 | 8/2016 |
| CN | 205880480 | 1/2017 |
| CN | 106502034 | 3/2017 |
| CN | 206906777 | 1/2018 |
| CN | 107795866 | 3/2018 |
| CN | 108139054 | 6/2018 |
| JP | H05323117 | 12/1993 |
| JP | 2008026409 | 2/2008 |
| WO | 2016039322 | 3/2016 |

* cited by examiner

LIGHT SOURCE DEVICE

CROSS-REFERENCE TO RELATED APPLICATIONS

This application is a continuation of International Application No. PCT/CN2019/076655, filed on Mar. 1, 2019, which claims priority to and the benefit of CN 201810712947.3, filed on Jun. 29, 2018. The disclosures of the above applications are incorporated herein by reference.

FIELD

The present disclosure relates to the field of lighting technologies, and particularly, to a light source device.

BACKGROUND

The statements in this section merely provide background information related to the present disclosure and may not constitute prior art.

With the enforcement of energy-saving and environmental-friendly regulations in the field of lighting, halogen lamps will gradually step off the stage of history. As an alternative, LED lighting has become the mainstream of today's lighting field. However, in the field of high-brightness lighting, LEDs can hardly replace halogen lamps and gas discharge lamps as the luminous efficiency of the LEDs is insufficient to satisfy a high-efficiency light output under large current. Consequently, multiple LEDs are usually used to form an array to obtain high-brightness output light. However, the use of multiple LEDs may cause problems in heat dissipation and wiring. Therefore, no low-cost LED solution is available for high-brightness lighting.

Laser light source, which is also a "cold light source" just like LEDs, also has advantages of energy saving and environmental protection, and the large-current lighting efficiency of the laser light source substantially exceeds that of LEDs. Thus, the laser light source has become a new research and development focus of high-brightness lighting and is considered to be the next generation of lighting technology. Generally, in order to obtain a white-light illumination beam we need, it is required to excite fluorescent powder with laser, and combine the remaining laser with fluorescence emitted by the fluorescent powder.

For a source of lighting, it is usually required that a lighting light spot has the uniform color, the center of the light spot is brighter than the periphery, and an irradiation distance is long. FIG. 1 illustrates a light source known in the prior art, in which a light beam emitted by a blue laser 101 is collimated by a lens 102 and then is incident to a beam splitter 103. The middle of the beam splitter is plated with a film that reflects blue light and transmits yellow light, and the rest of the beam splitter is plated with an anti-reflection film in the visible light waveband. A laser beam is reflected by the film that reflects blue light and transmits yellow light of the beam splitter 103 to a light collecting device 104, and then incident to a reflective light conversion device 105. The fluorescence and remaining blue light emitted by the light conversion device 105 are reflected by a reflective layer of the light conversion device 105 and then emitted from an incident surface of the light conversion device 105. Then, the fluorescence and remaining blue light are collected by the light collecting device 104, and then again, is incident to the beam splitter 103. The light incident to the region of the anti-reflection film of the beam splitter 103 is all transmitted, and for the light incident to the film that reflects blue light and transmits yellow light of the beam splitter 103, blue light is reflected and yellow light is transmitted. Such a technical solution causes the lack of blue light in a central area of outgoing light, making the color of the light spot non-uniform.

Another light source is shown in FIG. 2. A light beam emitted by a laser 201 is conducted by an optical fiber 202, and then is directly incident to a reflective light conversion device 204 through a lens 203. A reflection cup 205 receives and reflects the outgoing light from the light conversion device 204. Since the light conversion device 204 is disposed at the center of the reflection cup 205, a light beam at the center of the reflection cup 205 cannot be emitted, and thus the center of the outgoing light is a black hole. Such a technical solution leads to insufficient brightness of the center of the light spot.

In view of the above, a white-light illumination source in the prior art cannot meet requirements for uniform color and high brightness at the center, and is huge in size.

SUMMARY

This section provides a general summary of the disclosure and is not a comprehensive disclosure of its full scope or all of its features.

The present disclosure provides a light device with a compact structure, a uniform color of outgoing light, and a high luminous efficiency.

The light source device includes a laser light source configured to emit first light, a refractive optical element, a light conversion device, and a light collecting device. The refractive optical element is disposed on a light exiting path of the laser light source and configured to guide the first light to be incident to a light conversion device. The refractive optical element includes a light-exiting surface, and light refracted by the light-exiting surface of the refractive optical element is deflected towards the light conversion device to exit. The light conversion device is disposed at a light-exiting side of the refractive optical element and configured to convert at least part of the first light into fluorescence and/or change light distribution of the first light. An incident surface and a light-exiting surface of the light conversion device are a same surface, a medium on the incident surface of the light conversion device has a Brewster's angle of a, and outgoing light of the refractive optical element is obliquely incident to the light conversion device at an incident angle of $\alpha-20°$ to $\alpha+10°$. The light collecting device is disposed at a light-exiting side of the light conversion device and configured to collect light emitted from the light conversion device and then emit it.

In some variations, the outgoing light of the refractive optical element is obliquely incident to the light conversion device at an incident angle of a. When the light is obliquely incident to the light conversion device at such an incident angle, light reflection during an oblique incidence can be reduced or minimized and light loss is reduced, thereby improving a light utilization rate, and inhibiting safety related issues caused by a laser leakage from a side.

In some variations, the first light is in a P polarization state when the first light is incident to the light conversion device. When the light in the P polarization state is incident at an angle close to Brewster's angle, its reflectivity is very low. In this way, specular reflection generated when the light beam is incident to the incident surface of the light conversion device can be reduced, an incidence rate is increased, the light utilization rate is improved, and a side leakage of laser is lowered.

In some variations, the laser light source includes a laser diode. A short side of a light exiting surface of a resonant cavity of the laser diode is perpendicular to a light incident surface of the first light emitted by the laser diode on the light conversion device, and an optical device through which the first light propagates from the laser light source to the light conversion device is a non-imaging optical device. In such a technical solution, a polarization direction of outgoing light of the laser light source within the light incident surface of the light conversion device is equivalent to that the laser light source exits in the P polarization state relative to the light conversion device (a person skilled in the art can understand that the P polarization state or S polarization state is determined relative to the light incident surface, and thus is a relative property, rather than an intrinsic property, of light), so the first light can be directly incident to the light conversion device in the P polarization state after passing through the refractive optical element, such that the light utilization rate is improved. If the first light does not undergo optical imaging from the laser light source to the light conversion device, it is indicated that rectangular imaging of a light exiting surface of a resonator of the laser diode does not form a light spot on a surface of the light conversion device (which will cause the light spot to be further elongated in a case of oblique incidence, making the light spot on the surface of the light conversion device in an inline shape). According to characteristics of an angle of divergence of outgoing light of the laser diode, an elliptical light spot will be obtained on the light-exiting surface of the refractive optical element, without optical imaging, and a long axis of the light spot is perpendicular to the light incident surface. And then, with the effect of oblique incidence, the light spot will be stretched into an "O" shape. Therefore, this technical solution will be able to obtain the outgoing light with a more uniform light distribution while using few optical devices.

In some variations, the laser light source and the light conversion device are thermally coupled to a same heat dissipation substrate. This solution can provide a more compact structure, and in addition, a heat dissipation device can be shared.

In some variations, the light conversion device is a wavelength conversion device. The wavelength conversion device converts the at least part of the first light into fluorescence and emits it.

The light conversion device can be implemented in other manners. In some other variations, the light conversion device is a light scattering and reflecting device, and the light scattering and reflecting device changes angular distribution of the at least part of the first light. This solution may convert Gaussian-distributed laser light into Lambertian-distributed light.

In some further variations, when the light conversion device is the light scattering and reflecting device, white light can be directly obtained by combining RGB laser light after the RGB laser light is incident to the light conversion device. The light is de-coherent after being scattered and reflected by the light scattering and reflecting device, such that the harm of direct laser emission is reduced.

In some variations, the refractive optical element is arranged in a space between the light collecting device and the light conversion device, and a projection of the light collecting device on a plane where the light conversion device is located covers a projection of the light-exiting surface of the refractive optical element on the plane where the light conversion device is located. This technical solution reduces a volume of the light source device in a direction perpendicular to a light exiting direction.

The refractive optical element can be an optical fiber having a beveled cut surface at an end, or a prism. Specifically, a light-exiting surface of the refractive optical element facing the light conversion device is the beveled cut surface, or one of the surfaces of the prism that forms an angle with the incident surface of the light conversion device. Consequently, after passing through the refractive optical element, the first light is guided to be incident to the incident surface of the light conversion device. In some specific variations, an angle formed between the light-exiting surface of the refractive optical element and the incident surface of the light conversion device is greater than 90 degrees.

The laser light source and the refractive optical element cooperate with each other. When the refractive optical element is the prism, the laser light source can be placed in an orientation corresponding to an incident surface of the prism, so that after a laser beam is incident to the prism, the laser beam is guided to be obliquely incident to the incident surface of the light conversion device. In at least one variation, an incident angle of the first light incident to the prism serving as the refractive optical element is Brewster's angle. This technical solution also reduces a light reflection loss of the first light when the first light enters the refractive optical element, and improves the light utilization rate of the first light.

In some variations, when the refractive optical element is an optical fiber having a beveled cut surface at an end, the laser light source can be placed at any position as long as it does not block the light from the light source device. An overall structure can be more compact by improving or optimizing position selection. The laser beam is guided through the optical fiber, and is obliquely incident to the incident surface of the light conversion device from the beveled cut surface at the end of the optical fiber, thereby improving the degree of design freedom.

In some variations, the light source device includes at least two laser light sources. Light beams of the at least two laser light sources are combined, and then are incident to the light conversion device through the refractive optical element. The light beams of the at least two laser light sources can be combined in such a manner that the laser beams are combined after light paths are changed through an optical element. The optical element can be a reflecting mirror, a prism, or the like.

In some other variations, the light source device includes at least two laser light sources, and at least two refractive optical elements corresponding to the at least two laser light sources in one-to-one correspondence. A light beam of each of the at least two laser light sources are incident to the light conversion device via a corresponding one of the at least two refractive optical elements.

The light beams of the at least two laser light sources irradiate and form light spots on the light conversion device, and the light spots completely overlap each other. Consequently, a high intensity of outgoing light can be achieved. And the uniformity of the light spots can be achieved by overlapping the light spots. Also, it is possible to obtain different intensities of outgoing light by controlling ON/OFF states of different laser light sources.

In some other variations, the light beams of the at least two laser light sources irradiate and form light spots on the light conversion device, and the light spots partially overlap each other or are separated from each other. By controlling ON/OFF states of different laser light sources, a shape of the light spot pattern is controlled, so as to achieve different lighting purposes.

In some variations, the light beams of the at least two laser light sources irradiate and form light spots on the light conversion device, the light spots partially overlap each other or are separated from each other, and the light spots on the light conversion device irradiated and formed by light beams of different laser light sources of the at least two laser light sources have different angles of outgoing light after being collected by the light collecting device. In these variations, by controlling ON/OFF states of the laser light sources, irradiation angles of the outgoing light can be controlled.

In some variations, in the light conversion device, particles of wavelength conversion material and binding material are uniformly mixed together to form fluorescent material, and then, the fluorescent material is coated on a substrate. The side coated with the fluorescent material serves as the incident surface of the light conversion device. The binding material can be, for example, silica gel or epoxy resin. The reflective light conversion device is also provided with a reflective layer between the substrate and the fluorescent material, so as to effectively reflect excited fluorescence to the light exiting direction. In order to improve the heat dissipation effect, a heat dissipation device can be provided on a back of the light conversion device, or the substrate can be set as a substrate having a heat conduction function, such as a metal heat conduction substrate. In this way, the heat emitted by the light conversion device can be conducted to the metal heat conduction substrate and can be eventually dissipated. A surface of the fluorescent material of the light conversion device is plated with an anti-reflection film to increase a light-exiting rate.

The present disclosure also provides a laser lighting device including the light source device described above. The laser lighting device can be applied to, for example, an automobile headlight, a laser spotlight, a laser flashlight, etc., but is not limited to the above examples.

Compared with the prior art, the present disclosure has the following beneficial technical effects.

The light source device of the present disclosure adopts the refractive optical element to refract the first light emitted by the laser light source, and thus the light is obliquely incident to the incident surface of the light conversion device arranged on the light-exiting side of the refractive optical element. On the one hand, the solution of first performing refraction and then performing oblique incidence allows the position of the laser light source to be more flexible compared to the solution of merely performing oblique incidence, so that the laser light source can be closer to the light conversion device, thereby reducing the volume of the light source device; and on the other hand, the outgoing light of the light conversion device is not blocked by the laser light source or the refractive optical element, and outgoing light spots with a uniform color can be obtained, especially a center light spot with high brightness can be obtained. In addition, the present disclosure reduces the reflectivity of P-polarized light in the first light by setting the incident angle of the outgoing light from the refractive optical element obliquely incident to the light conversion device to approximate Brewster's angle, and thus the issue of the side leakage of laser that can be caused by oblique incidence can be solved and safety can be improved.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

Figure 15:
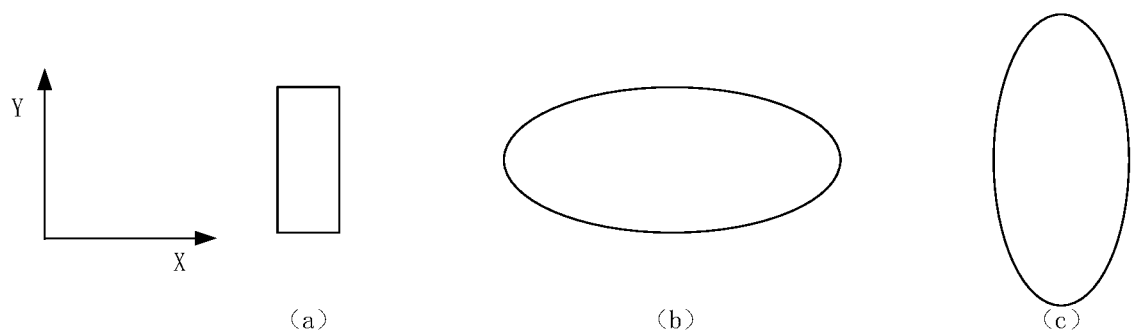
Figure 16:
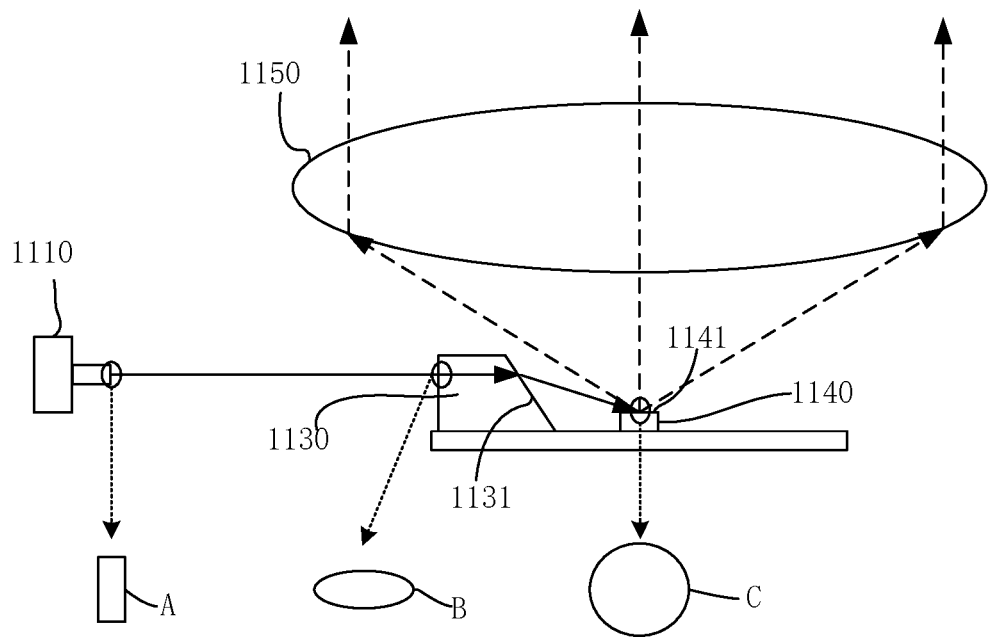

FIG. 15 is a schematic diagram of light spot changes of a laser diode light source where FIG. 15(a) shows a light exiting surface if a resonant cavity of a laser diode, FIG. 15(b) shows a spot of light leaving the light exiting surface of the resonant cavity of the laser diode after a short distance transmission, and FIG. 15(c) shows a spot of light leaving the light exiting surface of the resonant cavity of the laser diode when an imaging optical system is provided on the light exiting path of the laser diode; and FIG. 16 is a schematic diagram of a light source device according to a seventh form of the present disclosure.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

The present disclosure will be described in detail below with reference to the accompanying drawings and implementations.

Figure 1:
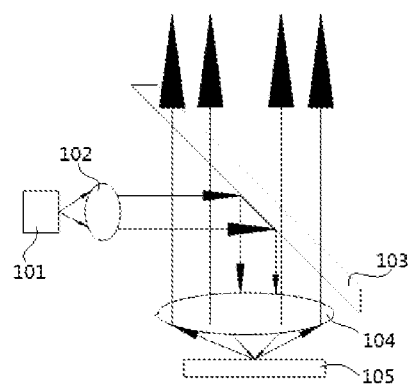
FIG. 1 is a schematic diagram of a conventional laser light source.
Figure 2:
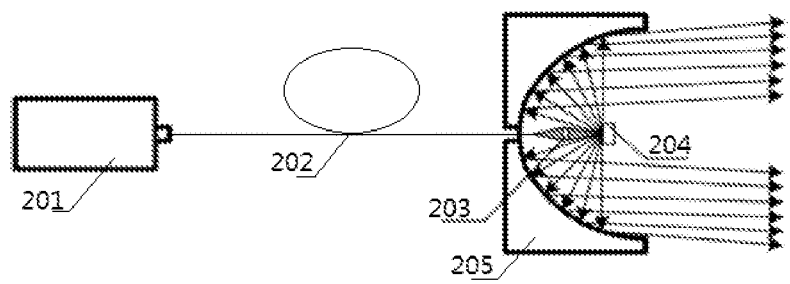
FIG. 2 is a schematic diagram of another conventional laser light source.
Figure 3:
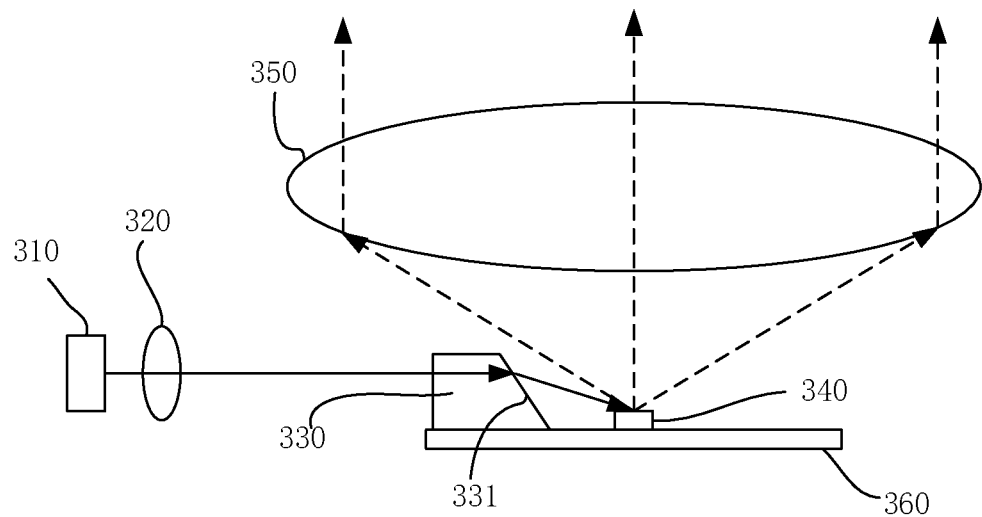
FIG. 3 is a schematic diagram of a light source device according to a first form of the present disclosure.

FIG. 3 illustrates a light source device according to the first form of the present disclosure. The light source device includes a laser light source 310, a lens 320, a refractive optical element, a light conversion device 340, and a light collecting device 350. In this form, the refractive optical element is a beveled glass 330. First light emitted by the laser light source 310 passes through and is collimated by the lens 320, and then it is incident to the beveled glass 330 in a light exiting path. The beveled glass 330 guides the first light to be incident to the light conversion device 340. Specifically, a light beam generated after the first light is refracted by a light-exiting surface 331 of the beveled glass 330 is deflected towards the light conversion device to exit.

In this form, the light conversion device 340 is a wavelength conversion device. A side of the light conversion device 340 above a substrate 360 and coated with fluorescent material (not marked) is a fluorescent surface. The fluorescent surface is an incident surface and a light-exiting surface of the light conversion device 340. The fluorescent material absorbs at least a part of the first light incident to the light conversion device 340 and emits fluorescence. The wavelength conversion device is also provided with a reflective layer (not marked) between the substrate 360 and the fluorescent material. The fluorescence and the remaining first light can be effectively reflected towards a light exiting direction by the reflective layer and received by the light collecting device 350. By providing the light-exiting layer, a light extraction efficiency can be significantly enhanced. A surface of the fluorescent material of the light conversion device may be coated with an anti-reflection film.

A surface opposite to the fluorescent surface is a back of the light conversion device 340. In order to improve the heat dissipation effect, a heat dissipation device can be provided on the back of the light conversion device 340, or the substrate 360 can be set as a substrate with a heat conduction function, such as a metal heat conduction substrate or a ceramic heat conduction substrate. The heat dissipated by the light conversion device 340 can be conducted to the heat conduction substrate and can be eventually dissipated. It can be understood that, the substrate 360 can also be a reflective substrate configured to reflect the light from the light conversion device 340 at the same time.

The light conversion device 340 is disposed at a light-exiting side of the beveled glass 330 of the refractive optical element. The beveled glass 330 has a bevel 331 facing a side of the fluorescent surface of the light conversion device 340. An inclination angle included between the bevel and the fluorescent surface of the light conversion device 340 coated with the fluorescent material is greater than 90 degrees, such that the light beam from the laser light source passes through the beveled glass 330 and is refracted on the bevel. Accordingly, the light beam is obliquely incident to the fluorescent surface of the light conversion device 340 coated with the fluorescent material, thereby exciting the fluorescence. Generally, the inclination angle ranges from 90 degrees to 180 degrees.

Figure 4:
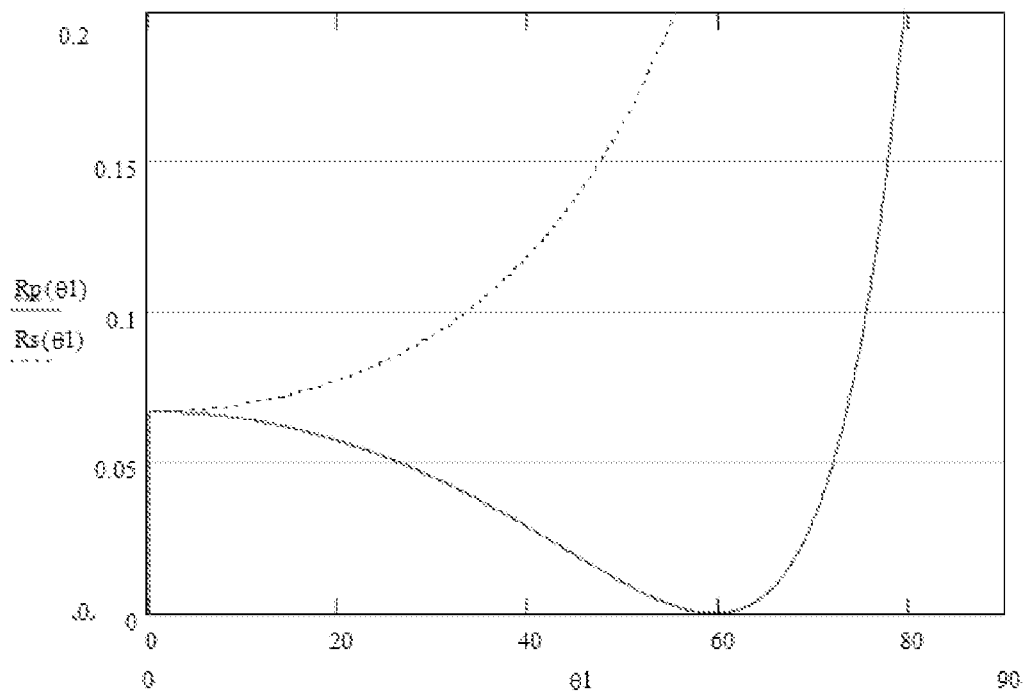
FIG. 4 is a diagram illustrating relationships of reflectivity of P light and S light on a glass surface with an incident angle.

In this form of the present disclosure, the outgoing light from the refractive optical element is obliquely incident to the light conversion device at an incident angle of α−20° to α+10°, where α is Brewster's angle of a medium on the incident surface of the light conversion device. As illustrated in FIG. 4, when a refractive index of a medium on a surface of the fluorescent material is 1.7, Brewster's angle is 60 degrees, so that most of the laser light in the P polarization state is transmitted into a layer of the fluorescent material, thereby effectively improving the utilization rate of the first light and inhibiting or preventing a side leakage of the first light. When the incident angle is in a range from −20° to +10° of Brewster's angle, although a reflectivity of P-polarized light is impossible to be zero, the reflectivity of P-polarized light is below 5%, which has the effect of improving the utilization rate of the first light and inhibiting or preventing the side leakage.

In this form, a polarization state of the laser light source 310 is set to be the P polarization state when being incident to the fluorescent surface of the light conversion device 340. It can be understood that, in the present disclosure, the setting of the incident angle of the first light on the light conversion device is effective for the P-polarized light, and it is not required that all the first light is in the P polarization state. As long as the first light incident to the light conversion device contains light in the P polarization state, the utilization rate of this part of the light can be improved.

The light collecting device 350 is disposed on a light-exiting side of the light conversion device 340, and is configured to collect and then emit the fluorescent light beam from the light conversion device 340. The laser beam emitted by the laser 310 is collimated by the lens 320, incident to the beveled glass 330, refracted by the bevel of the beveled glass 330, obliquely incident to the fluorescent surface coated with fluorescent material of the light conversion device 340 to excite the fluorescence, and then the excited fluorescence exits from the light collecting device 350. In some variations, the light collecting device 350 is a lens. In other variations, the light collecting device may also be a lens group, a curved reflection cup, or a TIR lens.

In this form, the refractive optical element, i.e., the beveled glass 330, is disposed in a space between the light collecting device 350 and the light conversion device 340, and a projection of the light collecting device 350 on a plane where the light conversion device 340 is located covers a projection of the light-exiting surface of the refractive optical element (the beveled glass 330) on the plane where the light conversion device 340 is located.

By adjusting a focal length of the lens 320 through the laser light source 310 and adjusting a distance between the laser light source 310 and the lens 320, a light spot incident to the beveled glass 330 can be smaller than a distance between the light conversion device 340 and the light collecting device 350. The laser beam can be focused by the lens 320 to a very small light spot, such as a light spot of 100 μm. In this regard, the beveled glass 330 can be very small in size, thereby improving the efficiency of the light collecting device 350.

An incident surface of the beveled glass 330 for receiving the light beam can be a vertical surface with respect to the incident first light. For example, in the form illustrated in FIG. 3, the laser light source 310 and the lens 320 are located at a left side of the beveled glass 330, the laser beam is incident to the vertical plane and directly reaches the beveled light-exiting surface 331 of the beveled glass 330 along the light path. The said left side is merely for explaining the orientation and position in view of FIG. 3, but not intended to limit the present disclosure. It is also conceivable that the laser light source 310 and the lens 320 are located at another side of the beveled glass 330.

Figure 5:
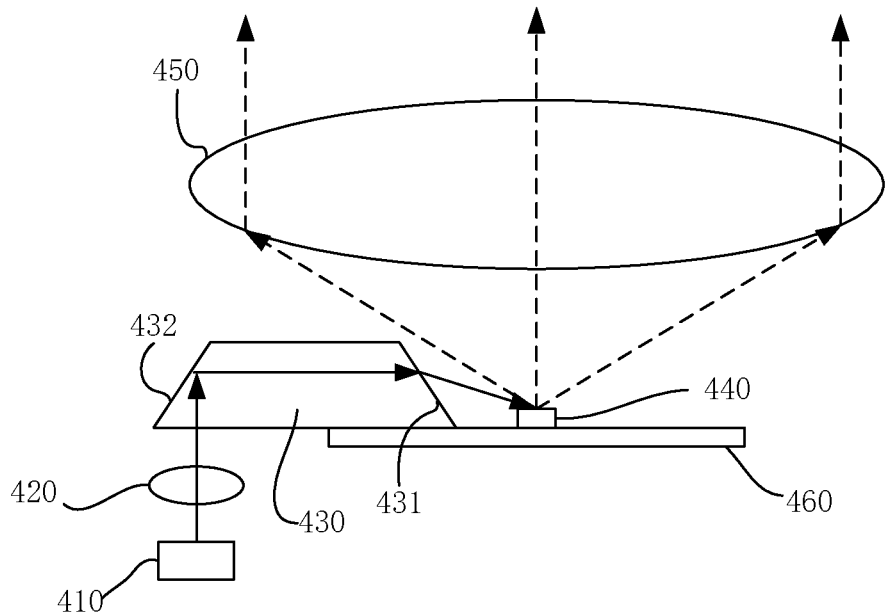
FIG. 5 is a schematic diagram of a light source device according to a second form of the present disclosure.

FIG. 5 illustrates a light source device according to the second form of the present disclosure. The light source device includes a laser light source 410, a lens 420, a refractive optical element 430, a light conversion device 440, a light collecting device 450, and a substrate 460. The refractive optical element is a prism 430 configured to reflect the incident light beam to the light-exiting surface of the refractive optical element. In this form, an incident side of the prism 430 is a beveled cut surface 432, which can reflect the incident light beam to the light-exiting surface 431. The laser light source 410, the lens 420, the light conversion device 440, and the heat dissipation device can be disposed at the same side of the light collecting device 450, allowing the structure to be more compact. As illustrated in FIG. 5, the laser light source 410 and the lens 420 are located behind a back of the light conversion device 440. A light path of the laser beam is changed after entering the prism 430 and being reflected by the beveled cut surface. The laser bean, after refracted by a beveled surface on a side of the outgoing light, is obliquely incident to the light conversion device 440, so as to excite the fluorescence, and then the excited fluorescence exits from the light collecting device 450. The "behind" here is merely for explaining the orientation and position in view of FIG. 5, but not intended to limit the present disclosure.

Figure 6:
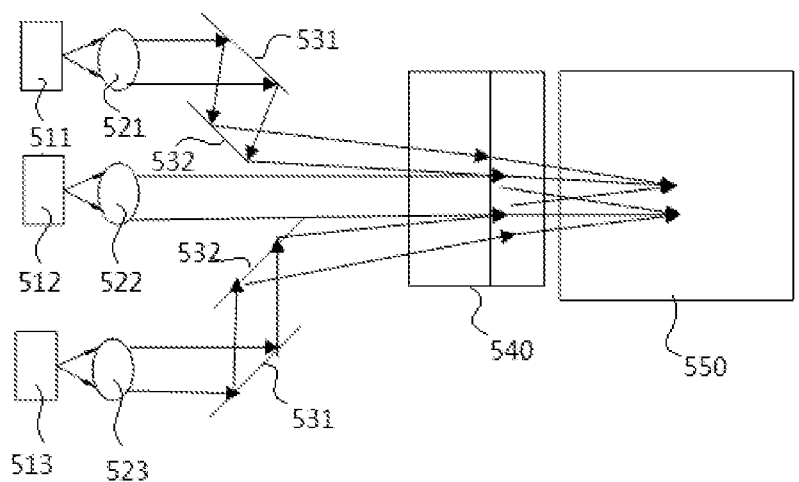
FIG. 6 is a schematic diagram of a light source device according to a third form of the present disclosure.

FIG. 6 is a top view of the light source device according to the third form of the present disclosure. The light source device includes at least two laser light sources. In the illustrated form, the light source device includes three laser light sources 511, 512, 513 arranged at a left side of a refractive optical elements 540 and a light conversion device 550. The light beams of the three laser light sources 511, 512, 513 are respectively collimated by lens 521, 522, 523, and then combined to enter the light conversion device 550 through the refractive optical element 540. Since multiple laser light sources share the refractive optical element 540, part of the laser beams with an initial light path failing to meet a desired incident angle is adjusted. In the form illustrated in FIG. 6, the laser beams emitted from the laser light source 512 and the lens 522 in the middle are directly incident to the refractive optical element 540, and laser beams emitted from the laser light sources 511, 513 and lenses 521, 523 at upper and lower sides are incident to the refractive optical element 540 with light paths changed by light path changing elements 531, 532, so as to meet the desired incident angle. In this manner, the laser beams conform to an angle of the incident light conversion device 550, so as to effectively excite the fluorescence. The light path changing elements 531, 532 can be reflective mirrors, reflective lenses, other optical elements that may change light paths, or can be combinations of one or more of the above optical elements. The left side and the upper and lower sides here are merely for explaining the orientation and position in view of FIG. 6, but not intended to limit the present disclosure.

In the form illustrated in FIG. 6, the multiple laser light sources 511, 512, 513 correspond to the same one refractive optical element 540. In other variations, more than one refractive optical elements are provided and correspond to the laser light sources in one-to-one correspondence, and each of the refractive optical elements is configured to receive light beams from the corresponding one laser light source and respectively emit the light beams to the surface of the light conversion device. These refractive optical elements can be placed at different sides of the light conversion device.

Figure 7:
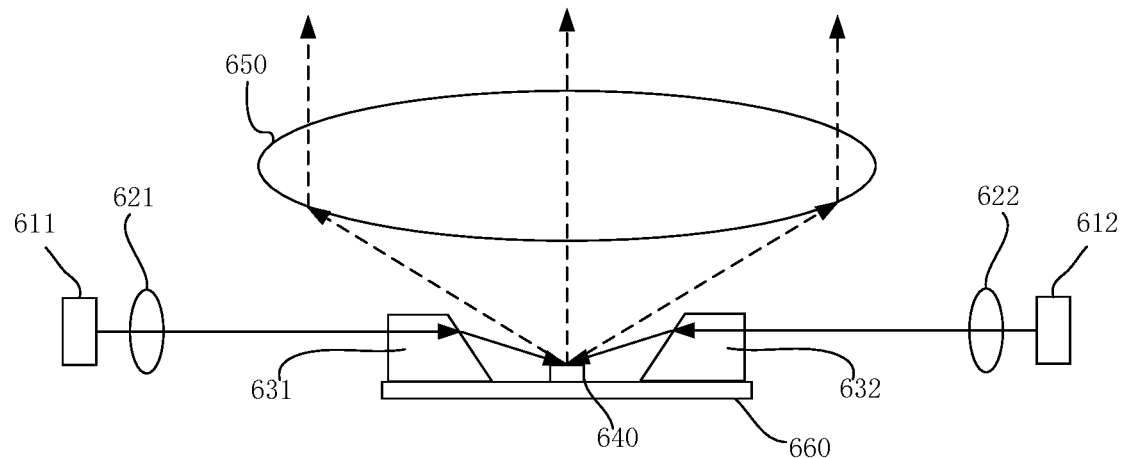
FIG. 7 is a schematic diagram of a light source device according to a fourth form of the present disclosure.

Referring to FIG. 7, the light source device includes two laser light sources 611, 612, two refractive optical elements 631, 632, a light conversion device 640, a light collecting device 650, and a substrate 660. In this form, light emitted by the two laser light sources 611, 612 respectively disposed on left and right sides of the light conversion device 640, after being collimated by the lenses 621, 622, is incident to the refractive optical elements 631, 632 corresponding to the laser light sources in one-to-one correspondence. The two refractive optical elements are also respectively disposed on left and right sides of the light conversion device 640. Then, the light is incident to the light conversion device 640 respectively via the corresponding refractive optical elements 631, 632. The left and right sides here are merely for explaining the orientation and position in view of FIG. 7, but not intended to limit the present disclosure. The two laser light sources are not limited to being disposed on two opposite sides, but can also be disposed on the same side, or on two adjacent sides, or disposed in other angular distribution manners.

In variations in which at least two laser light sources are provided, a light extraction intensity of the light source device of the present disclosure can be adjusted by controlling ON/OFF state of each laser light source.

Referring to FIGS. 8-11, light beams of at least two laser light sources on the light conversion device can have the following positional relationships that they are overlapped to form one light spot or they are partly overlapped, in order to correct power uniformity of laser light spots irradiated on the fluorescent material.

Figure 8:
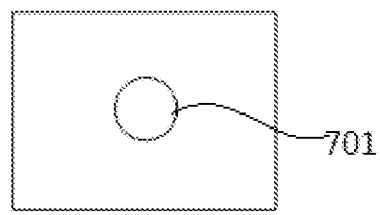
FIG. 8 is a schematic diagram illustrating a positional relationship of laser beams on a light conversion device according to one variation of the present disclosure.

As illustrated in FIG. 8, the light beams overlap and form one light spot 701. The brightness of the light spot can be a sum of the brightness of the light spots formed by respective laser light sources. By controlling ON/OFF states of the different light sources or controlling currents of the different laser light sources, the brightness of the overlapped light spot can be adjusted, and thus the brightness of the outgoing light of the light source device can be adjusted.

Figure 9:
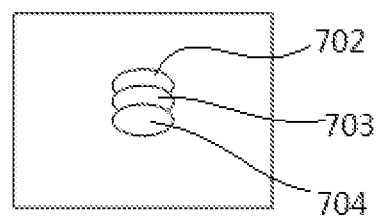
FIG. 9 is a schematic diagram illustrating a positional relationship of laser beams on a light conversion device according to another variation of the present disclosure.
Figure 10:
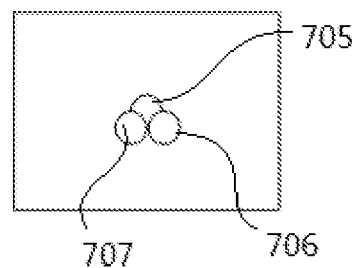
FIG. 10 is a schematic diagram illustrating a positional relationship of laser beams on a light conversion device according to yet another variation of the present disclosure.
Figure 11:
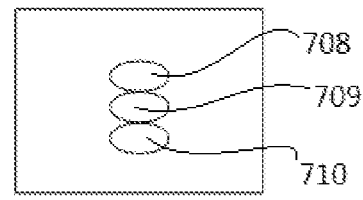
FIG. 11 is a schematic diagram illustrating a positional relationship of laser beams on a light conversion device according to yet another variation of the present disclosure.

As illustrated in FIG. 9, the light spots 702, 703, 704 of three laser light sources on the light conversion device distribute from top to bottom and partially overlap. As illustrated in FIG. 10, the light spots 705, 706, 707 of three laser light sources on the light conversion device light beams partially overlap in a form of triangle. The light beams of the at least two laser light sources on the light conversion device can also have such a positional relationship that light spots of different laser light sources are distributed at different positions and separated from each other. As illustrated in FIG. 11, the light spots 708, 709 and 710 of three laser light sources on the light conversion device are distributed from top to bottom and do not overlap each other. In each of the above three variations, ON/OFF states of the different laser light sources can be individually controlled to obtain light spot patterns of different shapes. After the light spot patterns are acted on by the light conversion device and collected by the light collecting device, light spots of different shapes for illumination can be formed at a final projection position, thereby achieving the diverse effects of lightning.

Figure 12:
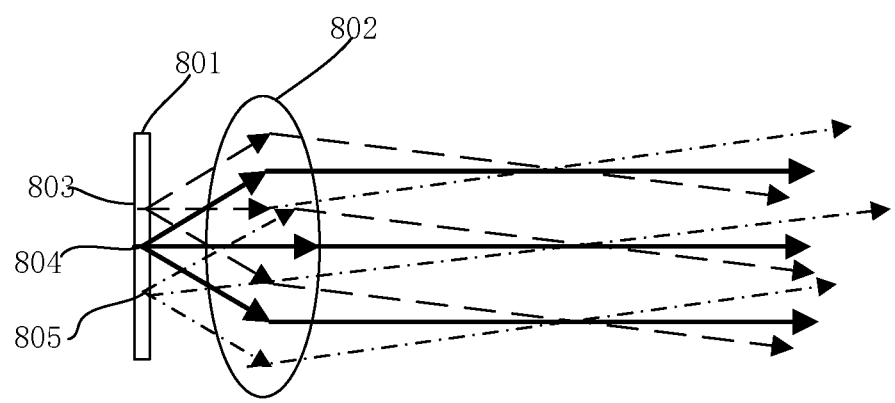
FIG. 12 is a diagram illustrating a relationship between angles of outgoing light beams and positions of laser irradiated on the light conversion device of the present disclosure.

Referring to FIG. 12, in some variations, light spots 803, 804, 805 of light beams of multiple laser light sources formed on the light conversion device 801 are distributed at different positions and separated from each other, and they correspond to different positions with respect to an optical axis of the light collecting device 802. After the light spot 803 on an upper part of the optical axis of the light collecting device 802 is collected, the light beam is deflected and emitted towards a lower part of the optical axis. After the light spot 805 on the lower part of the optical axis of the light collecting device 802 is collected, the light beam is deflected and emitted towards the upper part of the optical axis. After light spots on the light conversion device irradiated and formed by the light beams of different laser light sources are collected by the light collecting device, angles of outgoing light are different. The angles of the light beams emitted by the light collecting device 802 can be different. By switching on different laser light sources, the angles of the light beams emitted by the light sources can be controlled, so as to achieve the purpose of controlling the illumination in different areas, different directions, and different brightness.

Figure 13:
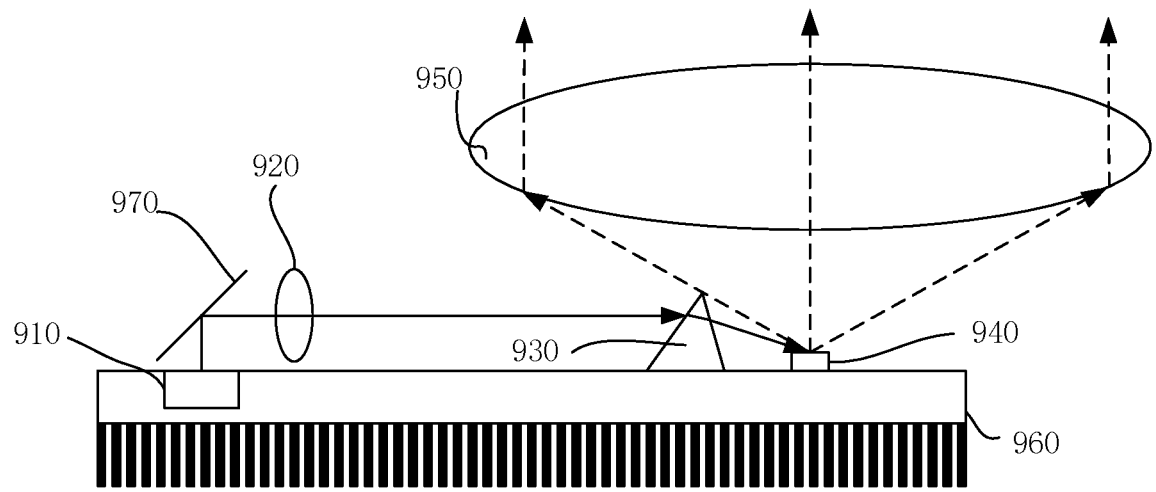
FIG. 13 is a schematic diagram of a light source device according to a fifth form of the present disclosure.

FIG. 13 is a schematic diagram of a light source device according to a fifth form of the present disclosure, the light source device includes a laser light source 910, a reflective element 970, a lens 920, a refractive optical element 930, a light conversion device 940, and a light collecting device 950. The laser light source 910 is disposed on a substrate 960. The light conversion device 940 is disposed on the same substrate 960. In some variations, the laser light source 910 can be embedded in the substrate 960.

The first light emitted by the laser light source 910 is reflected by the reflective element 970 and then collimated by the lens 920 before being incident to the refractive optical element 930. In some variations, the refractive optical element 930 is a prism. The light beam refracted by the light-exiting surface (not labeled) of the refractive optical element 930 is deflected towards the light conversion device 940 to exit. The light beam of the laser light source is guided to be incident to the light conversion device 940. The light conversion device 940 is disposed at the light-exiting side of the refractive optical element 930, and is configured to convert at least part of the first light into fluorescence and emit the fluorescence to the light collecting device 950. An incident surface and a light-exiting surface of the light conversion device 940 are the same surface. The light collecting device 950 is disposed at a light-exiting side of the light conversion device 940, and is configured to collect light emitted from the light conversion device 940 and then emit it.

A medium on the incident surface of the light conversion device 940 has Brewster's angle of $\alpha$, and outgoing light of the refractive optical element 930 is obliquely incident to the light conversion device 940 at an incident angle of $\alpha-20°$ to $\alpha+10°$. When the light is obliquely incident to the light conversion device 940 at such an incident angle, light reflection during an oblique incidence and light loss can be reduced, thereby improving a light utilization rate, and avoiding safety issues caused by a laser leakage from a side.

Further, the refractive optical element 930 is arranged in a space between the light collecting device 950 and the light conversion device 940. A projection of the light collecting device 950 on a plane where the light conversion device 940 is located covers a projection of the light-exiting surface of the refractive optical element 930 on the plane where the light conversion device 940 is located.

In this form, an incident angle of the first light incident to the refractive optical element 930 is Brewster's angle. This technical solution not only increases the light utilization rate when light is incident to the light conversion device 940, but also increases the light utilization rate when the light is incident to the refractive optical element 930.

Figure 14:
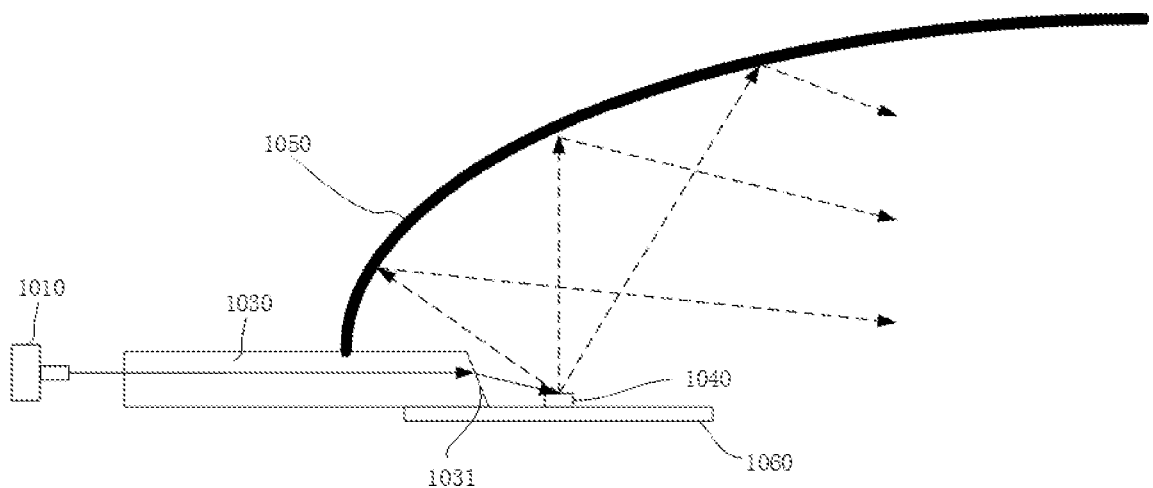
FIG. 14 is a schematic diagram of a light source device according to a sixth form of the present disclosure.

FIG. 14 is a schematic diagram of a light source device according to a sixth form of the present disclosure. The light source device according to this form includes a laser light source 1010, a refractive optical element 1030, a light conversion device 1040, a light collecting device 1050, and a substrate 1060.

The laser light source 1010 emits first light, and the first light is guided by the refractive optical element 1030 disposed on a light exiting path of the laser light source to be incident to the light conversion device 1040. The refractive optical element 1030 includes a light-exiting surface 1031. After being refracted by the light-exiting surface 1031, the first light is deflected towards the light conversion device 1040 to exit.

Outgoing light of the refractive optical element 1030 is obliquely incident to the light conversion device 1040 at an incident angle (in a range from $-20°$ to $+10°$ of Brewster's angle), the incident angle approximates the Brewster's angle. After conversion, the light collecting device 1050 collects the outgoing light of the light conversion device 1040 and then emits it.

The present form differs from the above-mentioned forms in the refractive optical element. The refractive optical element 1030 according to this form is an optical fiber with a beveled cut surface at an end. The first light propagates in the optical fiber along an axial direction of the optical fiber and is refracted at the beveled cut surface at the end, and then is obliquely incident to the light conversion device 1040. On the one hand, this form utilizes a small axial size of the optical fiber to reduce a volume of the light source device, and on the other hand uses a light guiding function of the optical fiber to make a position of the laser light source more flexible.

In this form, the refractive optical element 1030 can also be a polarization-maintaining optical fiber, which allows a polarization state of the first light propagating in the optical fiber to be basically unchanged. Consequently, more P-polarized light can be incident to the light conversion device 1040 to achieve a higher light utilization rate and to inhibit or prevent a side leakage of light.

The present form further has a difference in that the light collecting device 1050 in this form is a curved reflection cup, and specifically, a parabolic reflection cup or an ellipsoidal reflection cup. The refractive fiber element 1030 is arranged near an optical axis of the reflection cup to inhibit or prevent the outgoing light from being blocked. It can be understood that the light collecting device according to the foregoing variations can also be replaced with the light collecting device used in this form, both of which are equivalent to a technical solution of a total internal reflection lens (a TIR lens), which is not repeated herein.

In the above variations, the lens is generally arranged on a light path of the laser light source to collimate the first light. The lens is an imaging optical element, so that a light spot finally displayed on the surface of the light conversion device appears as an image of a light outlet of a laser (of course, due to factors such as oblique incidence, the image can be stretched), or in addition to the collimating lens, an imaging optical element including any other lens is set to image the light spot.

FIG. 15 illustrates a cross-sectional view of a light exiting surface of a resonant cavity of a laser diode, and the cross-sectional view is rectangular. A linear polarization degree of the laser diode is very high, and those skilled in the art can understand that a direction of a polarization vector is parallel to a direction of a long side, i.e., a direction Y of the coordinate axis in the figure). In addition, at a position of the light exiting surface, a divergence angle of light in the Y direction parallel to the long side is smaller than a divergence angle of light in a direction X parallel to a short side. For example, in a typical laser diode, a divergence half-angle of the light in the direction of the long side is $\theta_1=3.5°$, and a divergence half-angle of the light in the direction of the short side is $\theta_2=11°$.

When the light leaves a light exiting surface of the resonant cavity of the laser diode, the light beam expands rapidly in a direction parallel to the direction X, and the expansion in the direction parallel to the direction X far exceeds an expansion in the direction Y, allowing the light beam to have a cross section of an elliptical light spot shape illustrated in FIG. 15(b) after a short distance transmission, and the elliptical light spot shape is maintained to infinity. Directions of the length and width of the light spot are interchanged.

When an imaging optical system is provided on a light exiting path of the laser diode, a light spot in the distance will be an image of the light exiting surface of the resonator. Due to the influence of aberration, the light spot will appear in an approximate elliptical light spot shape illustrated in FIG. 15(c). The length and width of the light spot are consistent with those in (a).

FIG. 16 is a schematic diagram of a light source device according to a seventh form of the present disclosure. The light source device includes a laser light source 1110, a refractive fiber element 1130, a light conversion device 1140, and a light collecting device 1150. The laser light source 1110 emits first light. The first light is guided by the refractive optical element 1130 disposed on a light exiting path of the laser light source to be incident to the light conversion device 1140. The refractive optical element 1130 includes a light-exiting surface 1131. After being refracted by the light-exiting surface 1131, the first light is defected towards the light conversion device 1140 to exit. The light emitted from the refractive optical element 1130 is obliquely incident to the light conversion device 1140 at an incident angle approximating Brewster's angle (in a range from −20° to +10° of Brewster's angle). After conversion, the light collecting device 1150 collects the outgoing light of the light conversion device 1140 and then emits it.

The present form differs from the foregoing forms in that, the first light does not undergo optical imaging from the laser light source 1110 to the light conversion device 1140, i.e., no imaging optical element is provided between the laser light source 1110 and the light conversion device 1140, and only non-imaging optical elements are provided therebetween.

Moreover, in this form, the laser light source 1110 is a laser diode (which may include one or more laser diodes). The short side of the light exiting surface of the resonant cavity of the laser diode is perpendicular to the light incident surface of the first light emitted by the laser diode on the light conversion device 1140. In this case, the long side of the light exiting surface of the resonant cavity is parallel to the light incident surface, i.e., the first light is always the P-polarized light with respect to the light incident surface of the light conversion device.

According to the above description with reference to FIG. 15, since no imaging optical element is provided, a cross section of the light spot on the light-exiting surface of the laser light source 1110 is roughly the shape of the light spot A shown in FIG. 16, and thus the cross section of the light spot on the incident surface of the refractive optical element is roughly the shape of light spot B. The shape of the light spot here is obtained by observing along a propagating direction of the light beam. The shape of the light spot can be obtained by inserting a flat plate in the light path. After the first light is incident to the refractive optical element 1130, the first light is obliquely incident to the light-exiting surface 1131, so that the elliptical light spot B is stretched in a short axis direction. And then, the first light is obliquely incident to a surface 1141 of the light conversion device 1140, such that the light spot is further stretched along the short axis direction to obtain the shape C of the light spot shown in the figure. Such a technical solution modifies the shape of the light spot incident to the light conversion device, and allows the distribution of the surface of the light beam to be more uniform.

On the contrary, based on FIG. 16, if an imaging optical element is provided on the light path, the light spot having the shape illustrated in FIG. 15(c) will be formed on the incident surface of the refractive optical element. After the light beam undergoes two times of stretching of oblique incidence, a ratio of the long axis to the short axis of the ellipse is further increased, causing the shape of the light spot to have an approximate inline shape. In this manner, not only the uniformity of the distribution of the surface of the light beam is destroyed, but also the long light spot is not conducive to the collection of the light collecting device, reducing the light utilization rate.

If the long side of the laser diode is set to be perpendicular to the light incident surface of the first light on the light conversion device, which is equivalent to that the light spot A of FIG. 16 is rotated by 90°, after the first light passes through the imaging optical element, the shape of the light spot B can also be formed on the surface of the refractive optical element, and then the shape of the light spot C can be formed on the surface of the light conversion device. However, in this technical solution, the first light is S-polarized light at an exit position of the laser diode with respect to the light incident surface of the light conversion device. The first light can changed to P-polarized light only by adding a polarization conversion element such as a half-wave plate in the light path, so as to increase the utilization rate of the first light at a particular incident angle. In this regard, this technical solution not only adds the imaging optical element, but also adds the polarization conversion element, which greatly increases the cost.

Therefore, in the form illustrated in FIG. 16, the polarization characteristics of the laser diode, the characteristics of the change in the shape of the light spot caused by the oblique incidence, and the reflectivity characteristics of the linearly polarized light on the surface of the medium are combined to obtain the optical system with the fewest number of devices, a compact structure, and an excellent light distribution.

On the basis of the form of FIG. 16, without departing from the design concept of FIG. 16, it is also possible to combine the technical features and application scenes of multiple light sources, two incidences at Brewster's angle, and heat dissipation shared between the light source and the light conversion device according to the above forms or variations to obtain various implementations, which are not repeated herein. The refractive optical element according to the form shown in FIG. 16 may also be a polarization-maintaining optical fiber, as long as the polarization direction relative to the light incident surface of the light conversion device is provided or ensured to be unchanged when the first light propagates in the optical fiber.

In the above variations, as an example, the light conversion device is illustrated as the wavelength conversion device. That is, after the first light is incident to the light conversion device, at least part of the first light is converted into the fluorescence to exit. In some modification of the variations of the present disclosure, the above-mentioned wavelength conversion device may also be replaced with a light scattering and reflecting device, such as a diffuse reflection plate. The light scattering and reflecting device does not change the wavelength range of the light, but changes an angular distribution of at least part of the first light, especially changing Gaussian-distributed laser light to Lambertian-distributed light. In this way, the coherence of the laser light is eliminated, and the first light is uniform.

In some variations, the laser light source may include multiple laser elements with different wavelengths, such as red, green, and blue (RGB) laser elements. The light emitted by the RGB laser element is incident to the light scattering and reflecting device and mixed into uniform white light to exit, providing a light source device with pure laser white-light illumination/display. It can be understood that in some special application scenarios, monochromatic laser or mixed laser may also be used to obtain the outgoing light of other colors, and repeated description will not be made here.

The above are merely some variations of the present disclosure, but not intended to limit the scope of the present disclosure. Any equivalent structure or process transformations made using the specification and drawings of the present disclosure, or direct or indirect applications to other related technical fields, shall be included in the scope of the present disclosure.

Unless otherwise expressly indicated herein, all numerical values indicating mechanical/thermal properties, compositional percentages, dimensions and/or tolerances, or other characteristics are to be understood as modified by the word "about" or "approximately" in describing the scope of the present disclosure. This modification is desired for various reasons including industrial practice, material, manufacturing, and assembly tolerances, and testing capability.

As used herein, the phrase at least one of A, B, and C should be construed to mean a logical (A OR B OR C), using a non-exclusive logical OR, and should not be construed to mean "at least one of A, at least one of B, and at least one of C."

The apparatuses and methods described in this application may be partially or fully implemented by a special purpose computer created by configuring a general-purpose computer to execute one or more particular functions embodied in computer programs.

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. A light source device, comprising:
   a laser light source configured to emit a first light;
   a refractive optical element disposed on a light exiting path of the laser light source and configured to guide the first light to be incident to a light conversion device, wherein the refractive optical element comprises a light-exiting surface, and light refracted by the light-exiting surface of the refractive optical element is deflected towards the light conversion device to exit, the light conversion device disposed at a light-exiting side of the refractive optical element and configured to at least one of convert at least part of the first light into fluorescence and change light distribution of the first light, wherein an incident surface and a light-exiting surface of the light conversion device are a same surface, a medium of the incident surface of the light conversion device has a Brewster's angle of $\alpha$, and outgoing light of the refractive optical element is obliquely incident to the light conversion device at an incident angle of $\alpha-20°$ to $\alpha+10°$; and
   a light collecting device disposed at a light-exiting side of the light conversion device and configured to collect light emitted from the light conversion device and then emit it.

2. The device according to claim 1, wherein the laser light source comprises a laser diode, wherein a short side of a light exiting surface of a resonant cavity of the laser diode is perpendicular to a light incident surface of the first light emitted by the laser diode on the light conversion device, and an optical device through which the first light propagates from the laser light source to the light conversion device is a non-imaging optical device.

3. The device according to claim 1, wherein the laser light source and the light conversion device are thermally coupled to a same heat dissipation substrate.

4. The device according to claim 1, wherein the light conversion device is one of a wavelength conversion device that converts at least part of the first light into fluorescence and emits it and a light scattering and reflecting device that changes angular distribution of at least part of the first light.

5. The device according to claim 1, wherein the refractive optical element is arranged in a space between the light collecting device and the light conversion device, and a projection of the light collecting device on a plane where the light conversion device is located covers a projection of the light-exiting surface of the refractive optical element on the plane where the light conversion device is located.

6. The device according to claim 1, wherein the refractive optical element is an optical fiber having a beveled cut surface at an end.

7. The device according to claim 1, wherein the refractive optical element is a prism, and an incident angle of the first light incident to the refractive optical element is a Brewster's angle.

8. The device according to claim 1, wherein the laser light source comprises: at least two laser light sources and at least two refractive optical elements corresponding to the at least two laser light sources in one-to-one correspondence,
   wherein a light beam of each of the at least two laser light sources are incident to the light conversion device via a corresponding one of the at least two refractive optical elements.

9. The device according to claim 8, wherein the light beams of the at least two laser light sources irradiate and form light spots on the light conversion device, and the light spots completely overlap each other.

10. The device according to claim 8, wherein the light beams of the at least two laser light sources irradiate and form light spots on the light conversion device such that the light spots partially overlap each other or are separated from each other.

11. The device according to claim 10, wherein the light spots on the light conversion device irradiated and formed by light beams of different laser light sources of the at least two laser light sources have different angles of outgoing light after being collected by the light collecting device.

* * * * *